United States Patent
Kuiri et al.

(10) Patent No.: US 6,633,618 B1
(45) Date of Patent: Oct. 14, 2003

(54) METHOD AND APPARATUS FOR DIGITALLY REMOVING A DC-OFFSET SMALLER THAN ONE LSB

(75) Inventors: Tapio Kuiri, Oulu (FI); Simon Nicholas Walker, Surrey (GB); Alice Frances Wilson, Berkshire (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/456,758

(22) Filed: Dec. 7, 1999

(51) Int. Cl.[7] .......................... H04L 25/08; H04L 1/00; H04B 1/10; H03K 6/04; H03K 5/01
(52) U.S. Cl. ........................ 375/346; 375/219
(58) Field of Search ........................... 375/346, 350; 341/118, 120; 455/110, 296

(56) References Cited

U.S. PATENT DOCUMENTS 6,100,827 A * 8/2000 Boesch et al. ............... 341/118
6,166,668 A * 12/2000 Bautista et al. ............. 341/118

\* cited by examiner

*Primary Examiner*—Stephen Chin
*Assistant Examiner*—Curtis Odom
(74) *Attorney, Agent, or Firm*—Harrington & Smith, LLP

(57) ABSTRACT

A signal path, such as receiver signal path of a mobile station, includes an analog to digital converter (ADC) for representing an input signal as n-bits, the n-bit representation including a DC offset component. The signal path also includes a summing node having a first input for inputting the n-bit output of the ADC and a second input for inputting a k-bit representation of a DC offset component compensation value, where k=n+m, where m is a number of bits that represent a value smaller than one least significant bit (LSB) of said n-bit representation. The summing node operates to subtract the value appearing at the second input from the value appearing at the first input, and outputs a k-bit DC offset compensated value.

19 Claims, 4 Drawing Sheets

METHOD AND APPARATUS FOR DIGITALLY REMOVING A DC-OFFSET SMALLER THAN ONE LSB

FIELD OF THE INVENTION

This invention relates generally to radio telephones and personal communicators, referred to herein generally as mobile stations, and more particularly to radio frequency (RF) receivers for these and other devices that are subject to direct current (DC) offset signals.

BACKGROUND OF THE INVENTION

A problem that arises in RF receivers is an undesirable presence of a DC offset signal. For example, an analog to digital converter (ADC) can be used to convert an input RF signal, typically a downconverted intermediate frequency (IF) signal, to a digital representation thereof, which can then be further operated on by a digital signal processor (DSP) to perform various signal processing functions. These functions can include filtering, such as Finite Impulse Response (FIR) filtering, channel estimation, decoding, and so forth.

In some conventional receivers it was known to remove or compensate the DC offset in the analog circuitry, prior to analog to digital conversion. However, this approach-can require complex circuitry, and may further require the addition of a digital to analog converter (DAC) in order to generate a suitable DC offset compensation input signal for the ADC.

Previously, it was also known to digitally remove the DC offset with an accuracy of ½ of the Least Significant Bit (LSB) of the ADC. However, if the DC offset was less than ½ LSB, then it could not be removed.

As can be appreciated, as the number of bits of resolution of the ADC is decreased, for example when it is desired to increase conversion speed while reducing cost, the magnitude of the DC offset corresponding to ½ LSB will become larger. For example, if a one volt signal is expressed in an eight bit format, a step size of the 256 possible digital values will represent about 4 millivolts, and one half of the LSB will then be about 2 millivolts. However, if the same one volt signal is expressed instead in a six bit format, a step size of the 64 possible digital values will represent about 15.5 millivolts, and one half of the LSB will be about 7.7 millivolts.

If not removed the DC offset can have a detrimental effect on the subsequent signal processing of the digitized signal. This problem can be especially vexing in code division, multiple access (CDMA) type receivers, wherein it is typically the case that not as many bits of ADC resolution are required, as compared to, for example, time division, multiple access (TDMA) receivers.

One way to reduce the magnitude of the DC offset is to specify a more expensive ADC having more bits of resolution and/or a tighter tolerance for the DC offset output from the ADC. Unfortunately, this adds cost to the device containing the ADC. In addition, the required ADC may require a longer conversion time, and may as well have a larger power consumption, which is detrimental in battery-powered equipment. Furthermore, and for the case where two signal paths need to be digitized, such as when employing a receiver providing an Inphase and a Quadrature (I/Q) output, the overall cost can be essentially doubled.

A need thus exists to provide a technique to remove a DC offset signal component that has a magnitude that is less than ½ LSB of the ADC output, thereby enabling a designer to relax the standards and requirements for the receiver ADC(s). This in turn leads to cost reductions, without sacrificing accuracy.

OBJECTS AND ADVANTAGES OF THE INVENTION

It is a first object and advantage of this invention to provide an improved mobile station, that overcomes the foregoing and other problems.

It is a further object and advantage of this invention to provide embodiments of circuitry for removing the DC offset from the output of an ADC, where the DC offset has a magnitude that is less than ½ LSB.

SUMMARY OF THE INVENTION

The foregoing and other problems are overcome and the objects of the invention are realized by methods and apparatus in accordance with embodiments of this invention.

In accordance with a first embodiment of this invention a signal path, such as receiver signal path of a mobile station, includes an analog to digital converter (ADC) for representing an input signal as n-bits, the n-bit representation including a DC offset component. The signal path may be one of an Inphase (I) or a Quadrature (Q) signal path of the mobile station. The signal path also includes a summing node having a first input for inputting the n-bit output of the ADC and a second input for inputting a k-bit representation of a DC offset component compensation value, where k=n+m, where m is a number of bits that represent a value smaller than one least significant bit (LSB) of said n-bit representation. The summing node operates to subtract the value appearing at the second input from the value appearing at the first input, and outputs a k-bit DC offset compensated value.

A filter, such as a finite impulse response (FIR) filter or an infinite impulse response (IIR) filter, is coupled to the output of the summing node. A negative feedback path is provided from an output of the filter to the second.input of the summing node for generating the k-bit representation of the DC offset component.compensation value.

In accordance with a second embodiment of this invention the signal path includes the ADC for representing the input. signal as n-bits, the n-bit representation comprising a DC offset component. The signal path further includes a filter, such as a FIR filter or an IIR filter, having an input coupled to the output of the ADC and an output for providing a filtered k-bit representation of the ADC output, where again k=n+m, where m is a number of bits that represent a value smaller than one least significant bit (LSB) of the n-bit representation. The summing node in this embodiment has the first input coupled to the filter output for inputting the k-bit output of the filter and the second input inputs the k-bit representation of the DC offset component compensation value. The summing node operates to subtract the value appearing at said second input from the value appearing at said first input, and outputs the k-bit DC offset compensated value.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
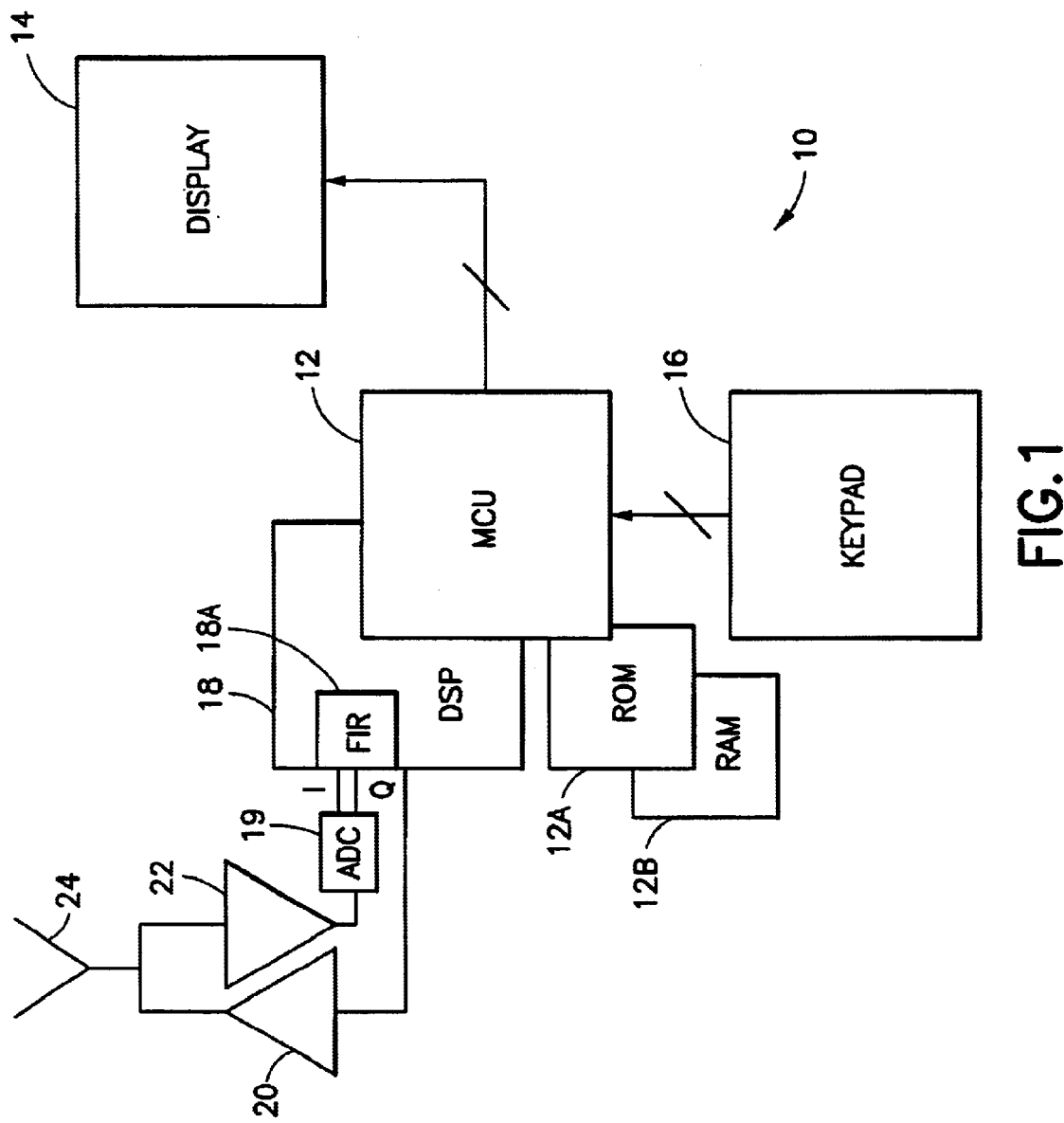
FIG. 1 is a simplified block diagram of an embodiment of a mobile station that is suitable for practicing this invention.

Referring first to FIG. 1, there is illustrated a simplified block diagram of an embodiment of a mobile station 10 that is suitable for practicing this invention. The mobile station 10 may be a radiotelephone, such as a cellular telephone or a personal communicator. The mobile station 10 includes a micro-control unit (MCU) 12 having an output coupled to an input of a display 14 and an input coupled to an output of a keyboard or keypad 16. The keypad 16 enables characters to be entered for display on display 14, as well as mobile station 10 control functions to be exercised. The MCU 12 is assumed to include or be coupled to some type of a read-only memory (ROM) 12A for storing an operating program, as well as a random access memory (RAM) 12B for temporarily storing inputted characters from the keypad 16 or the receiver 22, as well as other required data, scratchpad memory, etc.

Of most interest to the teachings of this invention, the mobile station 10 has a wireless or radio section that includes a digital signal processor (DSP) 18, or equivalent high speed processor, as well as a wireless transceiver comprised of a transmitter 20 and a receiver 22, both of which are coupled to an antenna 24. An output of the receiver 22 is coupled to an ADC block 19 (actually two ADCs) which provides I and Q digital outputs to the DSP 18. The DSP 18 may implement a FIR filter block 18A (actually two FIR filters, one for the I channel and one for the Q channel), as well as other desired signal processing blocks (not shown). In other embodiments the FIR filters 18A could be separate, external digital processing blocks that feed their outputs into the DSP 18.

Figure 2A:
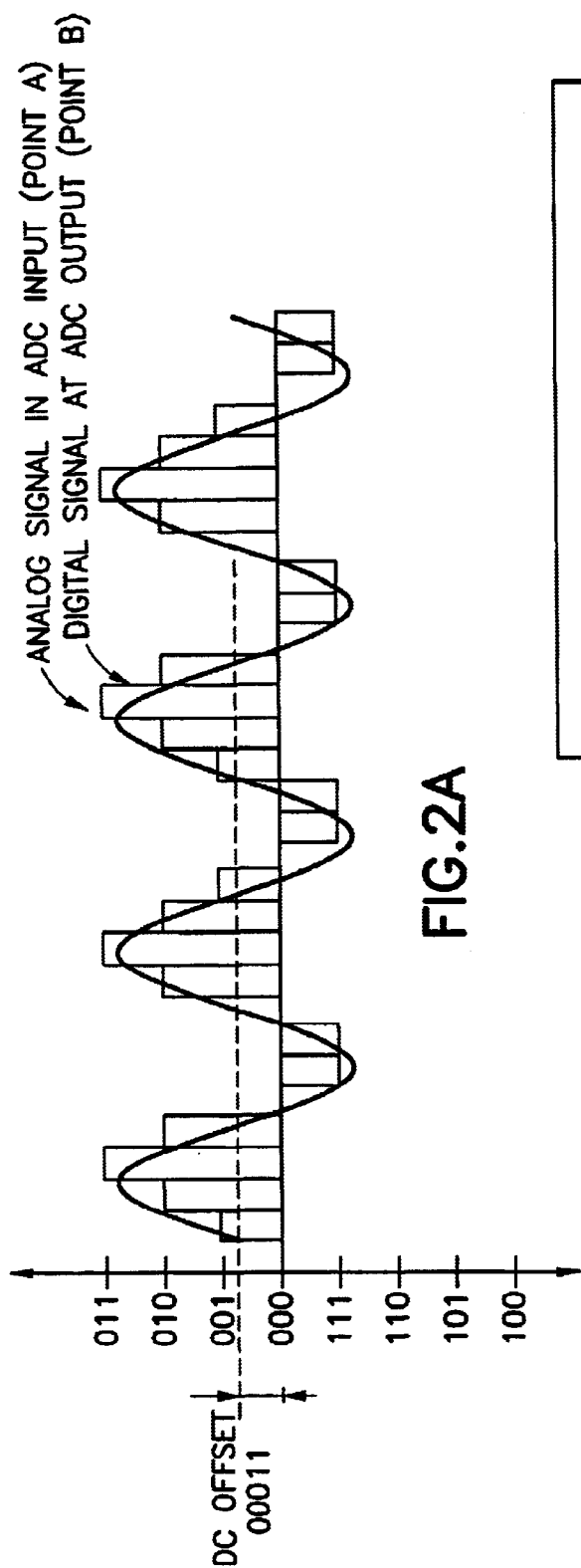
FIG. 2A is a waveform diagram depicting the analog input signal of the ADC and the corresponding digital output signal, as well as the undesirable DC offset component.
Figure 2B:
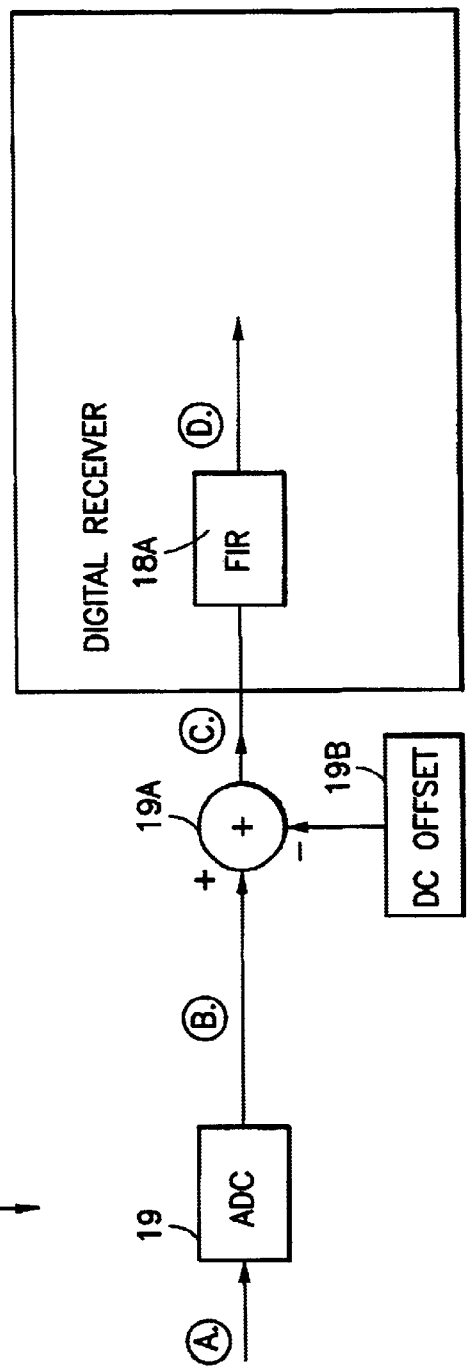
FIG. 2B is a simplified block diagram of circuitry for digitally removing the DC offset component, in accordance with an aspect of this invention.
Figure 2C:
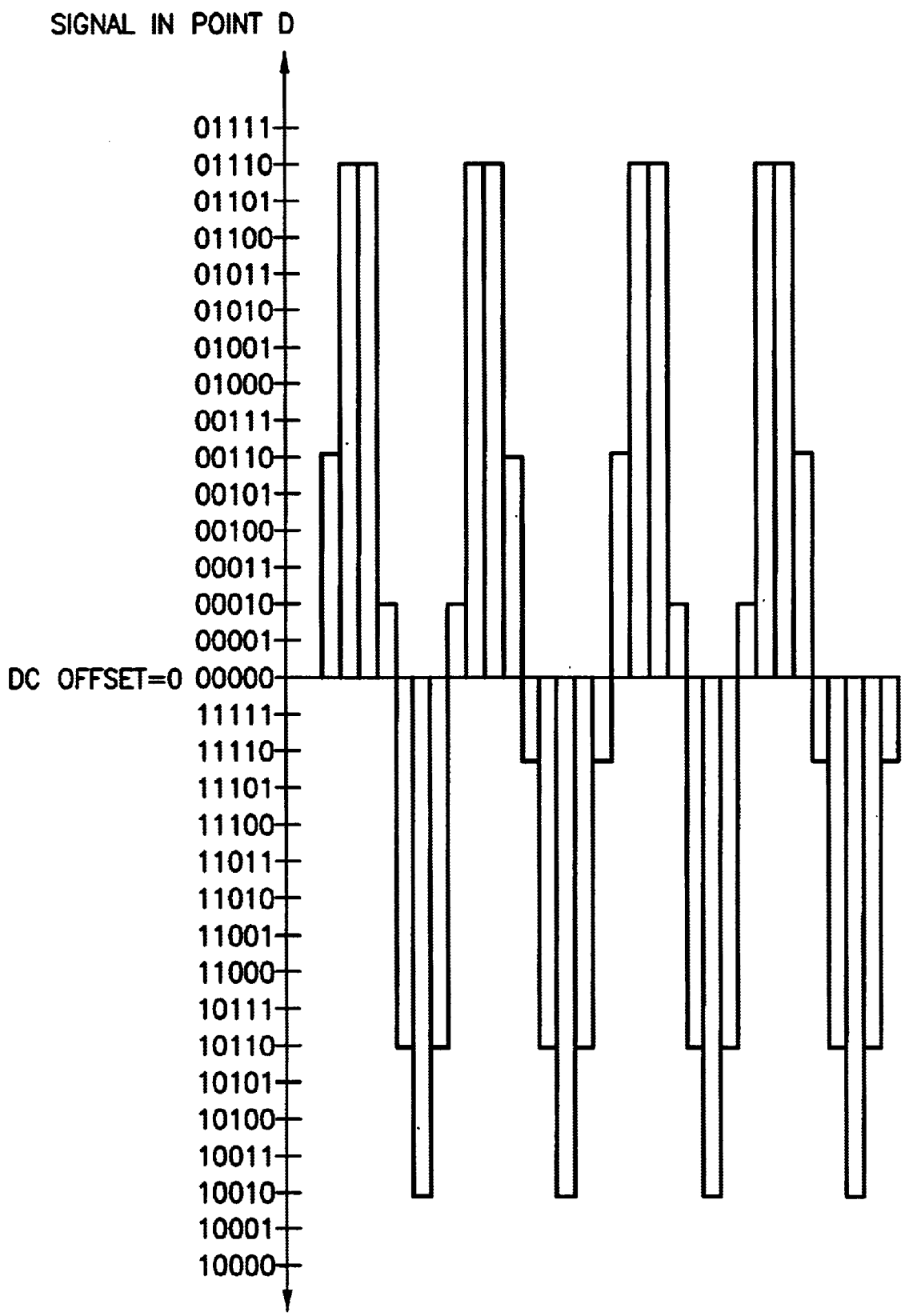
FIG. 2C is a waveform diagram depicting the digital output of the FIR filter shown in FIGS. 1 and 2B, illustrating that the DC offset component of the ADC output has been removed.

FIG. 2A is a waveform diagram depicting a representative analog input signal of the ADC 19 and the corresponding digital output signal, as well as the undesirable DC offset component. The referenced Points A and B are shown in FIG. 2B, which depicts simplified block diagram of circuitry for digitally removing the DC offset component, in accordance with an aspect of this invention. This circuitry is shown as a summing junction or node 19A and a DC offset block 19B. Note that the output of the ADC is fed to the positive input of the summing node 19A, while the output of the DC offset block 19B is fed to the negative input of the summing node 19A, and is thus subtracted from the ADC output. The resulting output of the FIR filter 18A is shown in FIG. 2C, wherein it can be seen that the DC offset component has been removed.

In further detail, note in FIG. 2A that the DC offset level has a value in binary of 00011, that is, it is greater than one half LSB.

As shown in FIG. 2A, the (three bit) binary values assumed by the output of the ADC 19 (Point B) are as follows:

..., 001, 010, 011, 010, 000, 111, 111, 000, 010, 011, 010, 001, 000, 111, 111, ..., etc.

The (five bit) binary values assumed by the digital signal at Point C (the output of the summing node 19A) are as follows:

..., 00001, 00101, 01001, 00101, 11101, 11001, 11001, 11101, 00101, 01001, 00001, 11101, 11001, 11001, 11101, ..., (etc.)

Expressed in decimal, the values assumed by the digital signal at Point C (the output of the summing node 19A) are as follows:

..., 1,5,9,5,−3,−7,−7,−3,5,9,5,1,−3,−7,−7,−3 ..., (etc.)

Assuming FIR filter 18A taps 1,1 the signal at Point D (the FIR 18A output) assumes the following values (decimal):

..., 6,14,14,2,−10,−14,−10,2,14,14,6,−2,−10,−14,−10, −2, ..., (etc.)

which, when expressed in a 5-bit binary representation, is as follows (see also FIG. 2C):

..., 00110, 01110, 01110, 00010, 10110, 10010, 10110, 00001, 01110, 01110, 00110, 11110, 10110, 10010, 10110, 11110, ... (etc.)

It should be noticed that the DC offset component has been removed from the signal appearing at the output of the FIR filter 18A, which is the desired result.

Figure 3A:
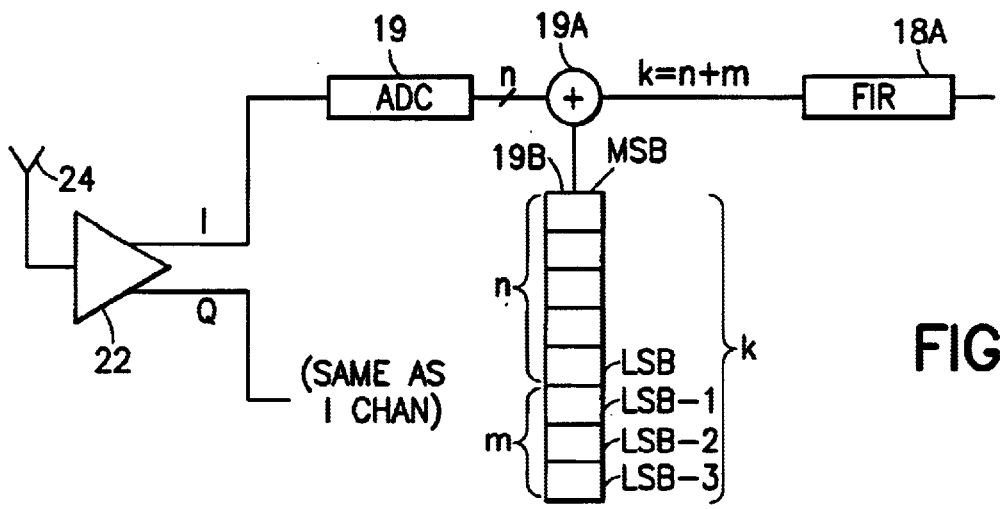
FIGS. 3A and 3B are more detailed block diagrams of the DC offset block of FIG. 2B, and further illustrate a first embodiment of this invention wherein a negative feedback path exists around the FIR filter.
Figure 3B:
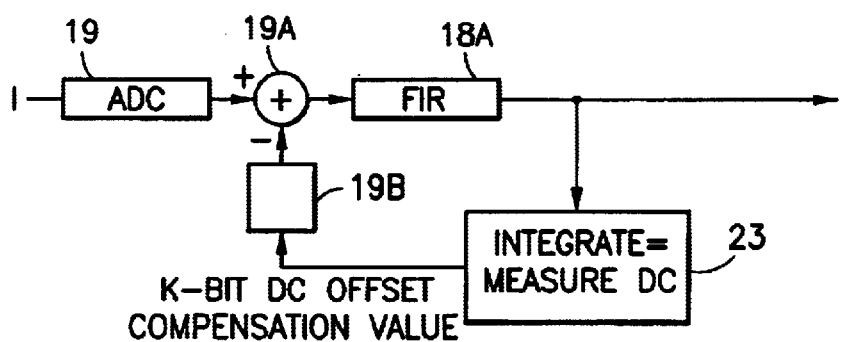

FIGS. 3A and 3B are more detailed block diagrams of the DC offset block 19B of FIG. 2B, and further illustrate a first embodiment of this invention wherein a negative feedback path exists around the FIR filter 18A. In FIG. 3A it can be seen that the DC offset block 19B is preferably embodied in a k-bit register comprised of n first bits corresponding to the n-bit output of the ADC 19, and m second bits corresponding to the desired number of bits smaller than one LSB (e.g., m=3 bits designated LSB-1, LSB-2, LSB-3). If, for example, one LSB represented 1 millivolt, then the first added bit (LSB-1) would represent 500 microvolts, the next added bit (LSB-2) would represent 250 microvolts, etc. The summing node 19A thus operates to subtract n+m=k bits from the n-bits output from the ADC 19A. The operation is thus as discussed above with respect to FIGS. 2A and 2B.

Note in FIG. 3A that only the I channel signal path is shown, with the construction of the Q channel signal path being assumed to be identical.

Note as well in FIG. 3B that an integration block 23 has an input coupled to the output of the FIR filter 18A for integrating the filtered output signal over some period of time. The integration period may vary, and if a low frequency component is present the integration period is extended. The output of the integration block 23 is a value representative of the DC offset signal, and is expressed in the n+m=k bits placed into the register 19B. A negative feedback loop is thus established such that as the DC offset value varies about zero, the value placed into the register 19B varies as well, always tending to drive the DC offset value back towards zero.

Figure 4A:
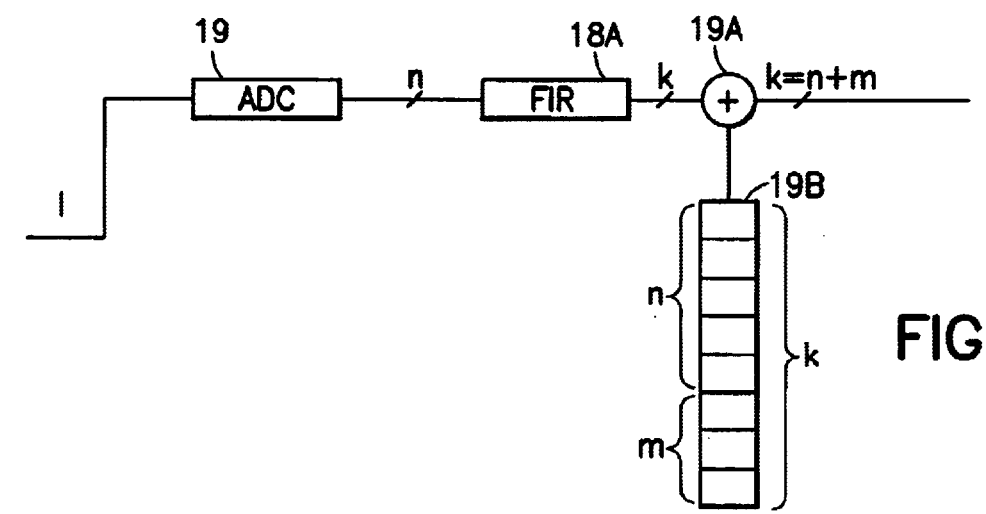
FIGS. 4A and 4B are also more detailed block diagrams of the DC offset block of FIG. 2B, and illustrate a second embodiment of this invention wherein the summing node is placed at the output of the FIR filter, as is the negative feedback path.
Figure 4B:
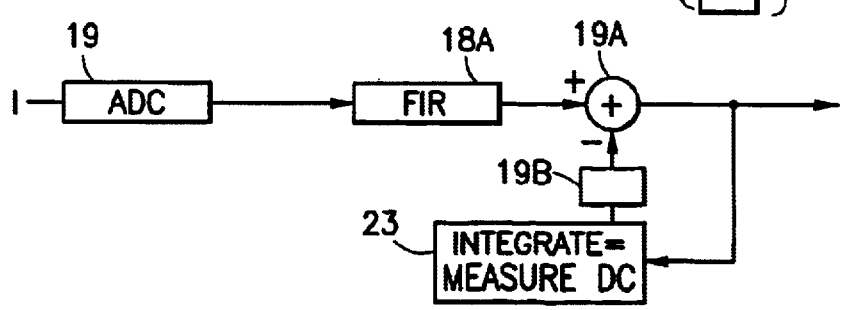

FIGS. 4A and 4B are also more detailed block diagrams of the DC offset block 19B of FIG. 2B, and illustrate a second, more preferred embodiment of this invention wherein the summing node 19A is placed at the output of the FIR filter 18A, as is the negative feedback path that comprises the integration block 23. Note that in this case the FIR filter 18A outputs k-bits, where k=n+m as before.

The integration block 23 is capable of measuring the DC offset, which has a value less than one half of the ADC LSB, because the FIR filter 18A has gain in the pass band. Thus, by including DC integrator 23, which also has gain, better results are achieved.

In general, the more bits that are used to measure the DC offset the more accurate is the final result.

It should be noted that the invention does not require that a FIR be used, and other filter types could be used as well. For example; an Infinite Impulse Response (IIR) filter could be used instead of the FIR filter 18A that was described thus far.

The teachings of this invention find use in various types of signal paths, and are not limited for use with received signal paths of mobile stations, such as cellular telephones and personal communicators. When used in a mobile station, however, the disclosed embodiments are particularly useful in CDMA mobile stations, including Wide Band CDMA mobile stations, wherein the ADCs may be specified to have a more limited range of bits than in some other types of mobile stations.

Thus, while the invention has been particularly shown and described with respect to preferred embodiments thereof, it will be understood by those skilled in the art that changes in form and details may be made therein without departing from the scope and spirit of the invention.

What is claimed is:

1. A signal path, comprising:
   an analog to digital converter (ADC) for representing an input signal as n-bits, the n-bit representation comprising a DC offset component; and
   a summing node having a first input for inputting the n-bit output of the ADC and a second input for inputting a k-bit representation of a DC offset component compensation value, where k=n+m, where m is a number of bits that represent a value smaller than one least significant bit (LSB) of said n-bit representation, wherein said summing node operates to subtract the value appearing at said second input from the value appearing at said first input, and to output a k-bit DC offset compensated value.

2. A signal path as in claim 1, and further comprising a filter coupled to the output of said summing node.

3. A signal path as in claim 1, and further comprising a finite impulse response (FIR) filter coupled to the output of said summing node.

4. A signal path as in claim 1, and further comprising an infinite impulse response (IIR) filter coupled to the output of said summing node.

5. A signal path as in claim 2, and further comprising a negative feedback path from an output of said filter to said second input of said summing node for generating said k-bit representation of the DC offset component compensation value.

6. A signal path as in claim 1, wherein said signal path comprises a signal path of a mobile station.

7. A signal path as in claim 1, wherein said signal path comprises one of an Inphase (I) or a Quadrature (Q) signal path of a mobile station.

8. A signal path, comprising:
   an analog to digital converter (ADC) for representing an input signal as n-bits, the n-bit representation comprising a DC offset component;
   a filter having an input coupled to an output of said ADC and an output for providing a filtered k-bit representation of said ADC output, where k=n+m, where m is a number of bits that represent a value smaller than one least significant bit (LSB) of said n-bit representation; and
   a summing node having a first input for inputting the k-bit output of said filter and a second input for inputting a k-bit representation of a DC offset component compensation value, wherein said summing node operates to subtract the value appearing at said second input from the value appearing at said first input, and to output a k-bit DC offset compensated value.

9. A signal path as in claim 8, wherein said filter is comprised of a finite impulse response (FIR) filter.

10. A signal path as in claim 8, wherein said filter is comprised of an infinite impulse response (IIR) filter.

11. A signal path as in claim 8, and further comprising a negative feedback path from an output of said summing node to said second input of said summing node for generating said k-bit representation of the DC offset component compensation value.

12. A signal path as in claim 8, wherein said signal path comprises a signal path of a mobile station.

13. A signal path as in claim 8, wherein said signal path comprises one of an Inphase (I) or a Quadrature (Q) signal path of a mobile station.

14. A method for removing a DC offset value in a signal path, comprising steps of:
   representing an input signal as n-bits, the n-bit representation comprising a DC offset component;
   subtracting from the n-bit representation a k-bit representation of a DC offset component compensation value, where k=n+m, where m is a number of bits that represent a value smaller than one least significant bit (LSB) of said n-bit representation;
   outputting a k-bit DC offset compensated value; and
   filtering the k-bit DC offset compensated value.

15. A method as in claim 14, where the step of filtering uses a finite impulse response (FIR) filter.

16. A method as in claim 14, where the step of filtering uses an infinite impulse response (IIR) filter.

17. A method for removing a DC offset value in a signal path, comprising steps of:
   representing an input signal as n-bits, the n-bit representation comprising a DC offset component;
   filtering said n-bit representation to provide a filtered k-bit representation of said n-bit representation, where k=n+m, where m is a number of bits that represent a value smaller than one least significant bit (LSB) of said n-bit representation; and
   subtracting from the k-bit output of said filter a k-bit representation of a DC offset component compensation value for providing a k-bit DC offset compensated value.

18. A method as in claim 17, where the step of filtering uses a finite impulse response (FIR) filter.

19. A method as in claim 17, where the step of filtering uses an infinite impulse response (IIR) filter.

* * * * *